United States Patent [19]

Hentz et al.

[11] 4,062,462
[45] Dec. 13, 1977

[54] METHOD FOR ORIENTING AN ARTICLE

[75] Inventors: Lyle J. Hentz, Whitehall; Willard G. Otto, Schnecksville, both of Pa.

[73] Assignee: Western Electric Co., Inc., New York, N.Y.

[21] Appl. No.: 703,031

[22] Filed: July 6, 1976

Related U.S. Application Data

[60] Division of Ser. No. 414,481, Nov. 9, 1973, Pat. No. 3,982,979, which is a continuation-in-part of Ser. No. 374,436, June 28, 1973, abandoned.

[51] Int. Cl.² ............................................. B65G 47/24
[52] U.S. Cl. .................................. 214/152; 198/390; 214/1 BB
[58] Field of Search ................. 214/1 BB, 1 BE, 1 R, 214/152; 228/6 A, 180 A; 198/390, 383, 382

[56] References Cited

U.S. PATENT DOCUMENTS

| | | | |
|---|---|---|---|
| 3,078,335 | 2/1963 | Black | 198/383 X |
| 3,590,462 | 7/1971 | Mracek | 29/400 |
| 3,776,394 | 12/1973 | Miller | 214/152 X |

*Primary Examiner*—Robert J. Spar
*Assistant Examiner*—George F. Abraham
*Attorney, Agent, or Firm*—R. Y. Peters

[57] ABSTRACT

An article, such as a beam-lead semiconductor device, is precisely oriented by placing it on the end of a tubular member which is centered in a cavity having the form of inverted, truncated, pyramid. The smallest cross section of the cavity is smaller than the smallest article to be positioned. The member slides vertically within the cavity and is resiliently supported by a vacuum chamber for movement therewith. The chamber is lowered with a vertical oscillatory motion, while a slight vacuum is applied, to lower the article into the cavity and engage it intermittently with the walls of the cavity. This orients and centers the article in the cavity.

4 Claims, 8 Drawing Figures

FIG.-4
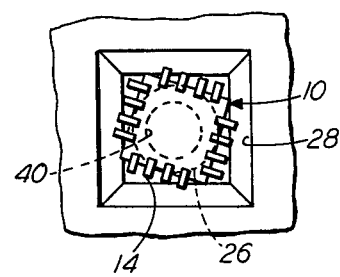
FIG.-6
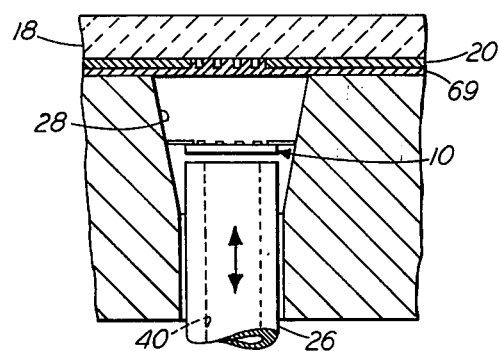
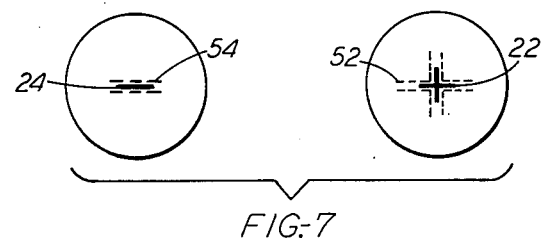
FIG.-7

METHOD FOR ORIENTING AN ARTICLE

This is a division, of application Ser. No. 414,481 filed Nov. 9,1973, now Pat. No. 3,982,979, which is a continuation-in-part of application Ser. No. 374,436 filed June 28,1973, now abandoned.

BACKGROUND OF THE INVENTION

1. Field of the Invention

This invention relates to methods for orienting an article without the use of a fluid to support it and, more paricularly, to orienting an article by intermittently engaging the article with the inwardly tapered walls of an orienting cavity while lowering the article therein.

2. Description of the Prior Art

Beam-lead semiconductor devices are usually bonded individually to their respective thin-film circuits on a substrate. In most cases, this individual bonding will suffice. However, in some cases it is necessary to bond several hundred like devices to as many sites on a substrate. It is desirable to bond the semiconductor devices en masse for economic reasons in such cases.

Mass bonding of the devices to thin-film circuit sites on a substrate requires orienting and locating the devices in an exact array, i.e., positioning them precisely, to match the sites on the substrate. Further, it requires aligning the substrate with the precisely positioned array of devices and mounting the devices on their sites on the substrate in condition for bonding.

Mass bonding of crossovers is disclosed in the prior art by J. A. Burns, "Bonded Crossovers for Thin Film Circuits," *Proceedings* 1971 21st *Electronics Components Conference*, IEEE, N. Y. In this method the crossovers are manufactured in an array on a polymide film in the same position they will have in the thin-film circuit. The crossovers are manufactured on the film in the location and orientation needed by the circuit so that no individual positioning of the crossovers is required. After Beam-lead semiconductor devices are usually bonded individually to their respective thin-film circuits on a substrate. In most cases, this individual bonding will suffice. However, in some cases it is necessary to bond several hundred like devices to as many sites on a substrate. It is desirable to bond the semiconductor devices en masse for economic reasons in such cases.

Mass bonding of the devices to thin-film circuit sites on a substrate requires orienting and locating the devices in an exact array i.e., positioning them precisely, to match the sites on the substrate. Further, it requires aligning the substrate with the precisely positioned array of devices and mounting the devices on their sites on the substrate in condition for bonding.

Mass bonding of crossovers is disclosed in the prior art by J. A. Burns, "Bonded Crossovers for Thin Film Circuits," *Proceedings* 1971 21st *Electronics Components Conference*, IEEE, N. Y. In this method the crossovers are manufactured in an array on a polymide film in the same position they will have in the thin-film circuit. The crossovers are manufactured on the film in the location and orientation needed by the circuit so that no individual positioning of the crossovers is requires. After bonding, the polymide film is easily removed by dissolving its adhesive.

This technique cannot be used for beam-lead semiconductor devices because they cannot be made in place on a polymide film. It is necessary, therefore, to manufacture the beam-lead devices separately and subsequently place them in the precise position on the substrate for bonding.

The devices are square and approximately one-sixteenth of an inch from tip to tip of the leads which project cantilever fashion from each side of square semiconductor bodies. The leads are approximately 0.7 mil thick, 4 mils wide and 8 mils long. The devices are, therefore, minute, and fragile and weigh very little. This makes them very difficult to position, especially without damaging them. For example, a method of centering a semiconductor slice by lowering it into a shallow dish or saucer on a cushion of air is not suitable for the tiny devices because they would blow air away.

This has been overcome by lowering the devices into a cavity and introducing a fluid to "float" the devices to a central position by virtue of the surface tension and meniscus of the fluid.

Also, prior art methods terminate the cavity in a pocket which is large enough to accommodate the largest part. Thus, the smallest device is not oriented or located as precisely as the largest one.

Once the devices are positioned in the cavities, the substrate to which the devices are to be bonded, must be aligned precisely with the cavities so that the devices may be mounted on, i.e., adhered to the sites on the substrate. The sites to which the devices are adhered are first coated with a hydrocarbon material such as eicosane. However, the substrate must be heated and then cooled rapidly, for economical reasons, to secure the devices. Once the devices are adhered to the substrate they may be compliant bonded by methods known in the art.

SUMMARY OF THE INVENTION

Accordingly, there is a clear need for a method which will orient and locate an article precisely without use of fluids or air cushions and do this for devices at both the minimum and maximum limits of the device tolerance with the same precision.

Thus, an object of the invention resides in providing new and improved methods for orienting an article without the use of a fluid to support it and, in particular, by engaging the article intermittently with the walls of an orienting cavity.

The invention contemplates placing the article on an elongated member centered in an inverted, truncated pyramidal cavity.

The elongated member is hollow and resiliently supported for sliding movement within the cavity. A slight vacuum is applied to the elongated member and it is lowered into the cavity witha slight vertical oscillation so that the article follows the elongated member into the cavity and intermittently engages the walls thereof. The action rotates the article to orient it and center it in the cavity. A plurality of such cavities permit simultaneous orientation and location of a plurality of such articles in a predetermined relationship.

BRIEF DESCRIPTION OF THE DRAWINGS

The invention, together with its various features and advantages, can be understood from the following more detailed description in conjuction with the accompanying drawings, in which:

FIG. 4 is a plan view of a beam lead device in approximate position in a cavity of the apparatus of FIG. 3;

FIG. 6 is a cross sectional view of cavity enlarged;

FIG. 7 is a view of fiducial marks through a microscope; and

DETAILED DESCRIPTION OF THE INVENTION

Figure 1:
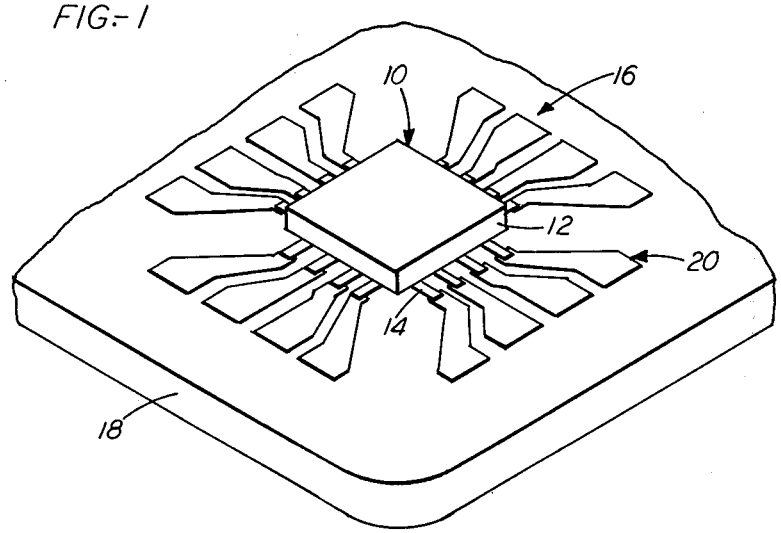
FIG. 1 is an isometric view of a beam-lead integrated circuit on a substrate site.

A beam-lead semiconductor device 10, refer to FIG. 1, may be a beam-lead integrated circuit, transistor or diode. The device 10 is extremely small. The device 10 includes a body 12 about 0.002 inch thick and 0.040 inch on a side having a plurality of leads 14 (about 0.0007 inch thick by 0.004 inch wide) that extend about 0.008 inches beyond such body 12.

Figure 2:
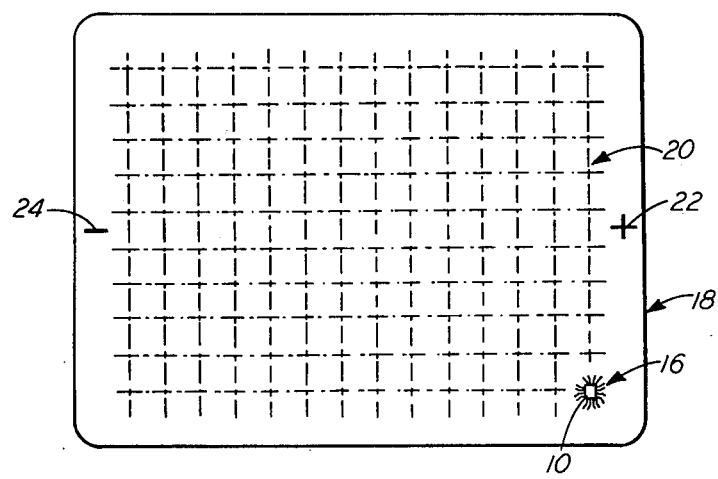
FIG. 2 is a plan view of a substrate showing a plurality of the sites of FIG. 1.
Figure 3:
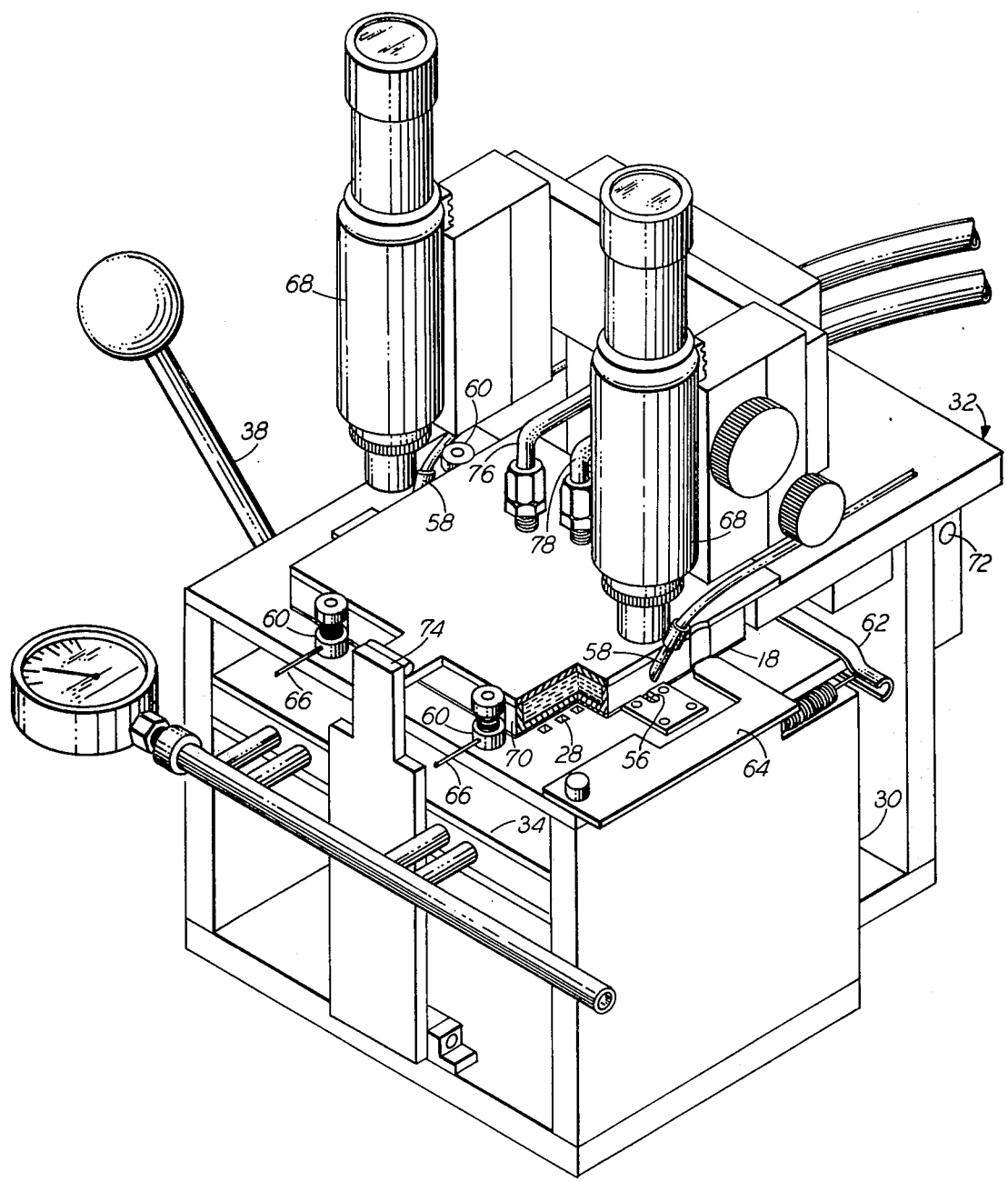
FIG. 3 is an isometric view of an apparatus for carrying out the present invention.

The devices 10 are bonded to sites 16 on a substrate 18, refer to FIGS. 1 and 2, which has a thin-film printed circular 20 and fiducial marks 22 and 24 formed thereon by methods well known in the art, e.g., vapor deposition. The circuit 20 on the substrate 18 has a multiplicity of sited 16, e.g., in this illustrative example of the invention there are 399 such sites, to which 399 of the beam-lead devices 10 are bonded simultaneously. The fiducial marks 22 and 24 bear a predetermined relation to the sites 16.

The substrate 18 is usually an alumina sheet (about .030 inch thick by 3¾ inch wide by 4½ inches long). Alumina substrates this thin are translucent.

The devices 10 are made in an array on a semiconductor wafer by methods well known in the art. When the wafer is separated into the individual devices 20, such devices must be tested and the array expanded for use. In so doing, the original precise orientation and location of the devices is disturbed. As a result, to bond the devices 10 to the sites 16, the devices must be precisely located and oriented in an expanded array that corresponds to such sites 16.

Figure 5:
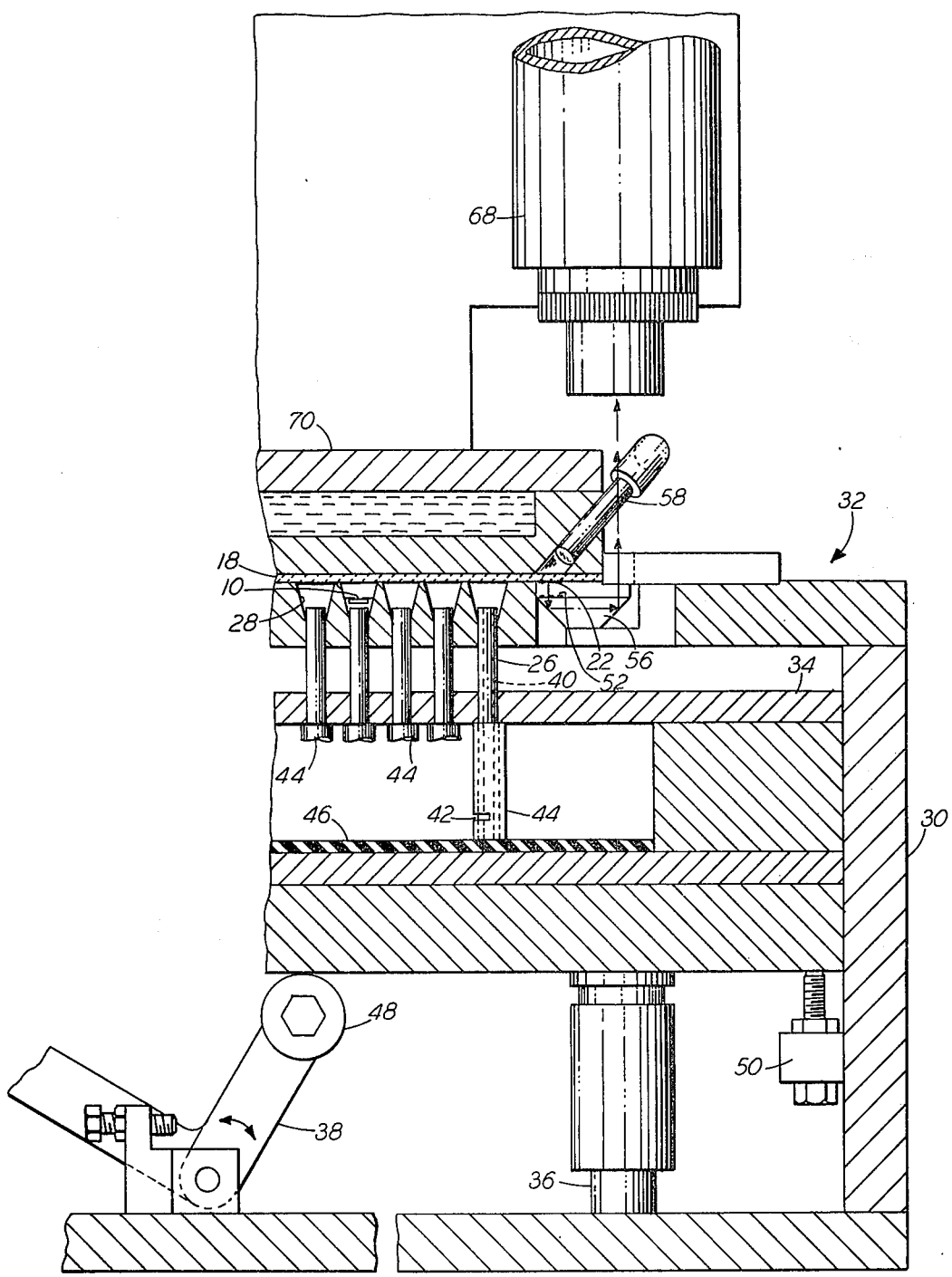
FIG. 5 is a partial cross sectional view of apparatus.

The necessary orientation and location is achieved by placing the device 10 on the end of a tube 26, refer to FIG. 5, which extends coaxilly through a cavity 28 in a base 30 of an apparatus designated generally by the numeral 32, and lowering the device 10 into the cavity.

The cavity 28 is in the form of a truncated, inverted pyramid, having a square cross section, wide enough at its upper end to accommodate the largest device and its deviation from the axis of the cavity 28. The cavity tapers inward and downward until it is narrower than the smallest device which is to be oriented and located. Thus, when a device 10 spans the cavity 28, it is centered and oriented.

When there are a plurality of devices 10 and cavities 28, all of the devices will be centered in their respective cavities regardless of individual differences in size. Further, if the cavities 28 are precisely oriented and located, the devices 10 will be precisely positioned regardless of size.

The tube 26 is mounted coaxially for vertical movement within the cavity 28 and is long enough so that its upper end may be slightly above the top of the cavity. The tube 26 is supported at its lower end in a vacuum chamber 34 which may be raised or lowered on guide pins 36 by a bell crank 38. A bore 40 of the tube 26 is open to the vacuum in the chamber 34 through a slot 42.

Also, a sleeve 44 is fixed to the end of the tube within the chamber 34 and the end of the tube 26 rests on a resilient material 46, such as that sold by E.I. duPont de Nemours & Co. unde the trade designation "Viton." The sleeve 44 retains the tube 26 so that it moves vertically with movement of the chamber 34. When there are a plurality of tubes 26 and cavities 28, as there are in this illustrative example of the invention, all of the tubes move simultaneously.

The tubes 26 must be free to slide axially in their guide holes in the chamber 34 and, therefore, clearance is required between the tubes and the walls of the guide holes. As a result, air leaks into the chamber, the amount depending on the extent of the clearance. The need to provide additional vacuum capacity to compensate for this may be avoided by the alternate stucture of FIG. 8.

Figure 8:
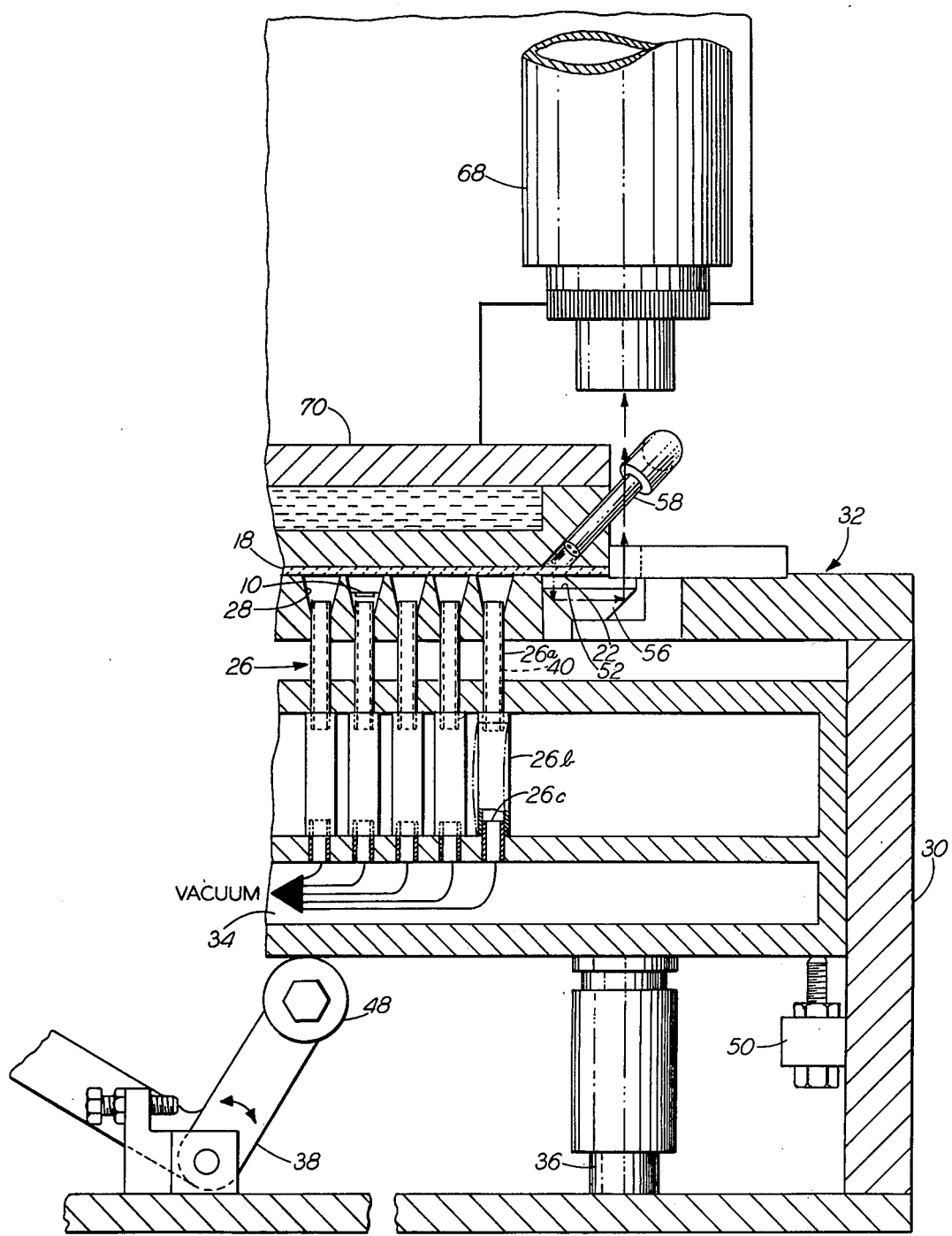
FIG. 8 is a partial cross sectional view of alternative apparatus.

Referring now to FIG. 8, the tube 26 includes a first portion 26a which cooperates with the cavity 28, and a second resilient portion 26b which connects the first portion 26a to the vacuum chamber 34. The second portion 26b slips over the first portion 26a at one end and over a nipple 26c, protruding from the vacuum chamber 34, at the other end. Thus, the sliding joint which might leak, is eliminated.

The second portion 26b may be 0.030 inches inside diameter by 0.065 inches outside diameter and one and one-quarter to one and one-half inches long. The material is silicone rubber, medical-grade tubing, such as that sold by Dow Corning under the trade designation "Silastic."

The devices 10 are placed in their approximate location nd orientation on the ends of the tubes 26, refer to FIG. 4, when the tubes are in their raised position.

The tubes 26 are then lowered to lower the devices 10 into the cavities 28. If off-center devices 10 are lowered into the cavities 28 in one continuous motion, they contact the wall on one side and assume skewed positions in the cavities. This may be overcome by moving the tubes 26 up and down a little, i.e., oscillating them vertically to intermittently engage the devices 10 as they are lowered into the cavities 28. This action overcomes the tendency of the devices 10 to adhere to the walls and aids in rotating and shifting them toward the center of the cavities 28.

The devices 10 follow the tubes 26 downward because of gravity. The affect of gravity is helped and the devices 10 made to follow the ends of the tubes 26 closely by applying a slight vacuum (about ¼ inch of Hg. below atmospheric pressure) to the chamber and the tubes. The slight vacuum causes a gentle downward flow of air that aids the orienting and locating action. Also, the vacuum may be pulsed to aid the action further. Still further aid may be achieved by holding any commercial vibrating tool against a side of the base 30. The devices 10 are accurately positioned, refer to FIGS. 5 and 6, when they reach the level at which they span the cavities.

The ends of the tubes 26 are lowered into the cavities 28 by rotating the bell crank 38 and roller 48 clockwise to lower the chamber 34. The extreme downward position is determined by an adjustable stop 50 which is set to that the ends of the tubes 26 are slightly below te level at which the smallest device 10 will span one of the cavities 28. The chamber 34 is raised by rotating the bell crank 38 counterclockwise. As a result, the oscillatory or up and down movement of the tubes 26 during the course of lowering them, is achieved by reversing the direction of the bell crank 38 several times. However, the bell crank 38 may be replaced, as is well known in the art, by other equivalent mechanisms, e.g., a cam and single revolution clutch, an air cylinder and valve, or raised surfaces at intervals along the undersurface of the chamber 34 for the roller 48 to act against. Any of these will cause the oscillatory motion of the tubes 26 and the intermittent engagement of the devices 10 with the walls of the cavities 28.

In order to adhere the positioned devices 10 to the sites 16, the sites are aligned with the cavities 28 by registering the fiducial marks 22 and 24 on the substrates 18 with indicator marks 52 and 54, respectively, refer to FIGS. 2, 5 and 7 on prisms 56 (only one of which is shown). The indicator marks 52 and 54 bear the same relation to the cavities 28 as the fiducial marks 22 and 24 bear to the sites 16.

In order to accentuate the fiducial marks 22 and 24 on the substrate 18, the backside of the substrate opposite the fiducial marks may be illuminated by fiber-optic light sources 58 (only one shown).

The fiducial marks 22 and 24 are registered with the indicator marks 52 and 54, respectively, by inverting the substrate 18 over the cavities 28 in the base 30 and seating it against eccentric collars 60. A spring-loaded member 62 applies slight force in one direction while a member 64 is tapped or pushed to apply a force at right angles to the first direction to seat the substrate 18 against the collars 60.

The substrate 18 is shifted to register the marks by rotating the collars 60 with levers 66. The marks 22, 24, 52 and 54 are viewed through microscopes 68, refer to FIG. 7, and the substrate 18 moved until the marks 22 and 24 register within the marks 52 and 54.

In order to adhere the devices 10 to the substrate 18 until the beam leads 14 can be bonded to conductors of the thin film circuits 20, the sites 16 are coated with a liquefiable substance 69, such as eicosane or the like. Eicosane is a hydrocarbon having the composition $C_{20}H_{42}$ and one of a homologous group of such hydrocarbons. The hydrocarbons is a solid below approximately 98° F and a liquid up to the boiling point of approximately 650° F. Other hydrocarbons in the group having higher or lower melting points may be used.

The substrate 18 is heated and cooled by a platen 70 which is mounted on the base 30 so that it pivots on a pin 72 and is held against the substrate 18 by a latch 74. The platen 70 is hollow and water is admitted through an inlet 76 and exhausted through an outlet 78.

The sites 16 are heated to a temperature above 98° F to liquefy the eicosane by flowing water at a temperature above this through the platen 70.

The devices 10, which have been positioned in the cavities 28 are retained in this position on the ends of the tubes 26 by increasing the vacuum in the chamber 34 (i.e., the pressure drops to about 15 inches of Hg. below atmospheric pressure). This holds the devices 10 firmly on the ends of the tubes 26 with the same orientation and location which resulted from lowering the devices into the cavities 28.

When the devices 10 are held firmly on the ends of the tubes 26, the tubes are raised by rotating the bell crank 38 counterclockwise until the devices 10 are pressed against the substrate 18. The ends of the tubes 26 rest on the resilient material 46 in the vacuum chamber 34 so that deformation of the material 46 compensates for any variation in the length of the tubes 26 and variations in the devices 10 and substrate 18. Thus, even pressure is applied to all devices 10.

In case of the alternative structure, refer to FIG. 8, when the first portions 26a, which are supported by the second portions 26b of the tubes 26, are raised by rotating the bell crank 38 counterclockwise to raise the vacuum chamber 34, the devices 10 on the ends of the first portions are pressed against the substrate 18. Variations in the thickness of the devices 10 and the substrate 18 and the length of the tubes 26 are compensated by buckling of the resilient second portions 26b, as shown in phantom in FIG. 8 for one of the second portions. The length of the tubing is so chosen that when the chamber 34 is in its raised position and the portions 26a are pressing all of the the devices 10 against the substrate, the buckled portions 26b exert a force of approximately 5 grams.

Cold water is passed through the platen 70 to cool it and the substrate 18 to room temperature, i.e., well below 98° F. This solidifies the eicosane and adheres the devices 10 to the sites 16 on the substrate 18.

Rather than place each device 10 separately on the end of a tube 26, sometimes it is more convenient to remove the devices 10 from the semiconductor wafer and place them on a carrier in the approximate position they will subsequently occupy on the substrate 18. The carrier may be a separate sheet of material or the substrate 18 itself. In either case, the devices 10 are adhered temporarily to the carrier with eicosane and the carrier inverted over the cavities 28 in the same manner as the substrate 18. The tubes 26 are raised to a level adjacent the devices 10 and a vacuum applied (about 15 inches of Hg. below atmospheric pressure). Hot water is passed through the platen 70 to heat the carrier and when the eicosane liquefies the devices 10 release and transfer to the ends of the tubes 26.

The vacuum is then reduced and the devices lowered into the cavities 28 to position them as heretofore described. If the carrier was the substrate 18 itself, the precisely positioned devices 10 need only be raised against the substrate and the eicosane solidified to adhere them to the sites ready for bonding. However, if the carrier was not the substrate 18, then the carrier must be removed and the substrate 18 substituted therefor. Then the eicosane on the substrate is liquefied and solidified to retain the devices 10 as previously described.

While specific embodiments have been described in the foregoing specification to illustrate the invention, it will be understood that the invention is not limited to these embodiments. Various changes and modifications may be made without departing from the spirit and scope of the invention.

It is claimed:

1. A method of orienting one of a plurality of articles without the use of a fluid for supporting the article, each of said articles having possible different dimensions one with respect to others, comprising the steps of:

placing the article on a member associated with a locating and orienting cavity having dimensions smaller than the dimensions of the smallest article; and engaging the article intermittently with the walls of the cavity while lowering the member and the article into the cavity to locate and orient the article at a point above the lower end of said cavity.

2. A method according to claim 1, wherein the member associated with the cavity is tubular and the step of engaging the article intermittently with the walls of the cavity includes evacuating the cavity intermittently through the bore of the tubular member to cause intermittent contact between the article and the wall of the cavity.

3. A method according to claim 1, wherein the member associated with the cavity is an elongated tube, the walls of the cavity are tapered inward to that the lower portion of the cavity is smaller in cross section than the cross section of the smallest article, and the step of intermittently engaging the article with the walls of the cavity includes vibrating the cavity walls.

4. A method according to claim 1, wherein the member associated with the cavity is an elongated tube, the walls of the cavity are tapered inward so that the lower portion of the cavity is smaller in cross section than the cross section of the smallest article, and the step of intermittently engaging the article with the walls of the cavity includes oscillating the tube vertically to cause the article to alternately make and break contact with the cavity walls.

* * * * *

UNITED STATES PATENT OFFICE
CERTIFICATE OF CORRECTION

Patent No. 4,062,462            Dated December 13, 1977

Inventor(s) Lyle J. Hentz-Willard G. Otto

It is certified that error appears in the above-identified patent and that said Letters Patent are hereby corrected as shown below:

Col. 1, cancel duplicated lines 30-53, inclusive.

Col. 2, line 13, "air" should be omitted.

Col. 3, line 23, "circular" should be --circuit--;
        line 36, "20" should be --10--;
        line 45, "coaxilly" should be --coaxially--.

Col. 4, line 62, "to" should be --so--; same line, "te" should be --the--.

Claim 3, line 6, "to" should be --so--.

Signed and Sealed this

Ninth Day of May 1978

[SEAL]

Attest:

RUTH C. MASON  
Attesting Officer

LUTRELLE F. PARKER  
Acting Commissioner of Patents and Trademarks